(12) United States Patent
Ohbayashi et al.

(10) Patent No.: US 6,710,634 B2
(45) Date of Patent: Mar. 23, 2004

(54) POWER ON RESET CIRCUIT

(75) Inventors: Shigeki Ohbayashi, Hyogo (JP);
Tadayuki Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/406,312

(22) Filed: Apr. 4, 2003

(65) Prior Publication Data

US 2003/0201807 A1 Oct. 30, 2003

Related U.S. Application Data

(62) Division of application No. 10/268,687, filed on Oct. 11, 2002, now Pat. No. 6,556,058, which is a division of application No. 09/784,142, filed on Feb. 16, 2001, now Pat. No. 6,459,552.

(30) Foreign Application Priority Data

Mar. 29, 2000 (JP) ........................................ 2000-090660
Sep. 25, 2000 (JP) ........................................ 2000-290423

(51) Int. Cl.[7] .............................................. H03L 7/00
(52) U.S. Cl. .................................................. 327/143
(58) Field of Search ................................ 327/142, 143, 327/198

(56) References Cited

U.S. PATENT DOCUMENTS

| | | |
|---|---|---|
| 5,166,546 A | 11/1992 | Savignac et al. |
| 5,323,067 A | 6/1994 | Shay |
| 5,442,312 A | 8/1995 | Walter |
| 5,528,184 A | 6/1996 | Gola et al. |
| 5,552,736 A | 9/1996 | Desroches |
| 5,696,461 A | 12/1997 | Germini |
| 5,703,510 A | 12/1997 | Iketani et al. |
| 5,886,549 A | 3/1999 | Naura |
| 5,898,327 A | 4/1999 | Tanaka |
| 5,929,673 A * | 7/1999 | Haigis et al. ............... 327/143 |
| 5,942,925 A | 8/1999 | Stahl |
| 6,005,423 A * | 12/1999 | Schultz ....................... 327/143 |
| 6,084,446 A | 7/2000 | Chen et al. |
| 6,104,221 A | 8/2000 | Hoon |
| 6,198,318 B1 | 3/2001 | Bhaskaran et al. |
| 6,252,442 B1 | 6/2001 | Malherbe |
| 6,259,284 B1 | 7/2001 | Hwang et al. |
| 6,288,584 B1 | 9/2001 | Wu et al. |
| 6,335,646 B1 | 1/2002 | Nagatomo |

FOREIGN PATENT DOCUMENTS

JP            6-232716       8/1994

OTHER PUBLICATIONS

"Integrated Electronics (2) –Revised–Circuit Technology", Hisayoshi Yanai, Minoru Nagata, Corona Publishing Co., Ltd., Jun. 20, 1979, pp. 151–155.

* cited by examiner

Primary Examiner—Jeffrey Zweizig
(74) Attorney, Agent, or Firm—McDermott, Will & Emery

(57) ABSTRACT

In a power on reset (POR) circuit, when power is turned on, an output signal of an inverter attains an H level and an N channel MOS transistor is rendered conductive. The potential of an input node of the inverter becomes a potential of a power supply voltage divided by a conductive resistance value R1 of a P channel MOS transistor and a conductive resistance value R2 of an N channel MOS transistor. Assuming that the threshold voltage of the inverter is 0.8 V and R1:R2=2:3, then the power supply voltage Vres at the time when signal POR# inverts its level becomes 1.33 V. Thus, this POR circuit can reliably be utilized even in a product designed to operate with 1.5 V incorporating a MOS transistor having a threshold voltage of 0.8 V.

1 Claim, 8 Drawing Sheets

POWER ON RESET CIRCUIT

This application is a divisional of application Ser. No. 10/268,687 filed Oct. 11, 2002, now U.S. Pat. No. 6,556,058, which is a divisional of application Ser. No. 09/784,142, filed Feb. 16, 2001 now U.S. Pat. No. 6,469,552.

BACKGROUND OF THE INVENTION

1. Field of the Invention

The present invention relates to power on reset circuits, and more particularly, to a power on reset circuit that is incorporated in a semiconductor device and generates a reset signal for resetting the semiconductor device at the time of power on.

2. Description of the Background Art

Conventionally, a semiconductor integrated circuit device (for example, DRAM, SRAM) is provided with a power on reset circuit (hereinafter, referred to as a "POR circuit") for resetting an internal circuit when an external power supply voltage VDD is turned on.

An output signal POR# of POR circuit remains at an L level until external power supply voltage VDD is raised from 0 V to a prescribed voltage Vres. When external power supply voltage VDD exceeds Vres, output signal POR# attains an H level. Voltage Vres is set lower than a certain range of the power supply voltage with which a product is guaranteed to normally operate. Herein, such a range is called a "guaranteed range". For example, if a product is designed to operate with 3.3 V (hereinafter, such product is referred to as a "3.3 V product"), the guaranteed range of the power supply voltage is normally from 3.0 V to 3.6 V. Thus, Vres is set approximately at 2.5 V in this case. During a time period in which power supply voltage VDD is not greater than Vres and signal POR# is at an L level, the internal circuitry of the semiconductor integrated circuit device, or more specifically, a redundant circuit of a memory device, a register or state machine of every kind, is initialized.

In the semiconductor integrated circuit device, in association with miniaturization of MOS transistors, the power supply voltage has been downscaled from initial 5 V to 3.3 V or to 2.5 V, further to 1.8 V or to 1.5 V. Consequently, Vres of POR circuit has also been downscaled.

FIG. 9 is a circuit diagram showing a configuration of such POR circuit 30, which is similar to the one disclosed in U.S. Pat. No. 5,703,510.

Referring to FIG. 9, POR circuit 30 includes a P channel MOS transistor 31, an N channel MOS transistor 32, capacitors 33, 34, and CMOS inverters 35–37. P channel MOS transistor 31 is connected between a line of power supply potential VDD and a node N1, and has its gate connected to node N1. P channel MOS transistor 31 constitutes a diode element. N channel MOS transistor 32 is connected between node N1 and a line of ground potential GND, and has its gate connected to a line of power supply potential VDD. N channel MOS transistor 32 constitutes a resistance element of high resistance. Capacitor 33 is connected between node N1 and a line of ground potential GND.

Inverter 35 includes a P channel MOS transistor 38 and an N channel MOS transistor 39. P channel MOS transistor 38 is connected between a line of power supply potential VDD and a node N2, and has its gate connected to node N1. N channel MOS transistor 39 is connected between node N2 and a line of ground potential GND, and has its gate connected to node N1.

Inverter 36 includes a P channel MOS transistor 40 and an N channel MOS transistor 41. P channel MOS transistor 40 is connected between a line of power supply potential VDD and node N1, and its gate is connected to node N2. N channel MOS transistor 41 is connected between node N1 and a line of ground potential GND, and its gate is connected to node N2. Inverters 35 and 36 constitute a latch circuit.

Capacitor 34 is connected between a line of power supply potential VDD and node N2. Node N2 is connected to an input node of inverter 37. An output signal of inverter 37 becomes signal POR#.

Hereinafter, Vres of POR circuit 30 will be described. In this POR circuit 30, to obtain Vres lower than that would be obtained by the POR circuit disclosed in the above-mentioned U.S. Pat. No. 5,703,510, the diode element (P channel MOS transistor 31) connected between the line of power supply potential VDD and node N1 is reduced from the two stages to one stage, and at the same time, the threshold voltage VTC of inverter 35 is reduced to the level of the threshold voltage VTN of N channel MOS transistor 39.

More specifically, threshold voltage VTC of CMOS inverter 35 is expressed as follows:

$$VTC = \frac{VDD + VTP + VTN\sqrt{B_R}}{1 + \sqrt{B_R}}$$

$$= \frac{\frac{VDD + VTP}{\sqrt{B_R}} + VTN}{\frac{1}{\sqrt{B_R}} + 1}$$

wherein VTP is a threshold voltage of P channel MOS transistor 38; $\beta_R$ represents a ratio $\beta_N/\beta_P$ between $\beta_N$ of N channel MOS transistor 39 and $\beta_P$ of P channel MOS transistor 38. $\beta_N$ represents a ratio $W_N/L_N$ of a gate width $W_N$ to a gate length $L_N$ of N channel MOS transistor 39, and $\beta_P$ represents a ratio $W_P/L_P$ of a gate width $W_P$ to a gate length $L_P$ of P channel MOS transistor 38. Thus, by adjusting $\beta_N = W_N/L_N$ and $\beta_P = W_P/L_P$, it is possible to make $\beta_R = \beta_N/\beta_P$ larger than 1, whereby VTC nearly equal to VTN is attained.

If node N1 is at an L level, P channel MOS transistor 40 of inverter 36 is rendered non-conductive, and N channel MOS transistor 41 is conductive. If $\beta_N$ of N channel MOS transistor 41 is made sufficiently small, potential V1 of node N1 becomes approximately equal to VDD−VTP, wherein VTP represents a threshold voltage of P channel MOS transistor 40.

If potential V1 of node N1 exceeds threshold potential VTN of inverter 35, potential V1 of node N1 inverts from an L level to an H level. Thus, power supply voltage VDD at the time when potential V1 of node N1 rises from an L level to an H level, i.e., Vres, becomes equal to VTN+VTP.

FIG. 10 shows time charts illustrating the operation of POR circuit 30 shown in FIG. 9. Referring to FIG. 10, at the initial state, node N1 is at a ground potential GND since it is grounded through a resistance element (N channel MOS transistor 32) of high resistance. Assume that external power supply potential VDD is switched on at time t0 and power supply potential VDD rises towards 1.8 V in proportion to time. When potential VDD>VTP, the diode element (N channel MOS transistor 31) turns on, and potential V1 of node N1 becomes equal to VDD−VTP.

At time t1, when potential V1 (=VDD−VTP) of node N1 exceeds threshold potential VTN of inverter 35, the output level of inverter 35 inverts from an H level to an L level, and the output level of inverter 36 rises from an L level to an H level, so that potential V1 of node N1 rises from VDD−VTP to VDD. Power supply voltage VDD at this time is Vres, and Vres=VTN+VTP in this POR circuit 30. Therefore, signal POR# is at an L level from time t0 to time t1, and it rises to an H level at time t1. Even if power supply voltage VDD fluctuates in a range higher than VTN afterwards, V1=VDD, and thus, signal POR# remains at the H level (time t1–t7). When power supply voltage VDD drops lower than VTN (time t8), MOS transistors 31, 38, 39, 40, 41 are rendered non-conductive. Electric charges stored in capacitor 33 are discharged through the resistance element (N channel MOS transistor 32) of high resistance, and POR circuit 30 returns to its initial state.

When power supply voltage VDD of a semiconductor integrate circuit device is downscaled, the threshold voltage of a MOS transistor should be reduced correspondingly. In practice, however, to lower power consumption by restricting a leakage current, the threshold voltage of MOS transistor is not downscaled. More specifically, the threshold voltage of MOS transistor, which was 0.8 V for 5 V and 3 V products, is maintained at 0.8 V even for 1.8 V and 1.5 V products. Thus, Vres of the POR circuit 30 shown in FIG. 9 becomes equal to VTN+VTP=0.8+0.8=1.6 V.

The guaranteed range of the power supply voltage for a 1.8 V product is 1.62 V to 1.98 V. Thus, the margin guaranteed by Vres=1.6 V as above is not large enough. Further, POR circuit 30 of FIG. 9 cannot be used for a 1.5 V product.

SUMMARY OF THE INVENTION

Accordingly, an object of the present invention is to provide a power on reset circuit that can be used even in a low power consumption semiconductor device operative with low power supply voltage.

The power on reset circuit according to the present invention includes: an inverter that drives a reset signal to an activated level in response to reception of a power supply potential and a reference potential and drives the reset signal to an inactivated level in response to a potential of its input node exceeding a prescribed threshold potential; a first resistance element having one electrode receiving a power supply potential and the other electrode connected to the input node of the inverter; and a first transistor of a first conductivity type having its first electrode receiving a reference potential and its second electrode connected to the input node of the inverter, and rendered conductive in response to the reset signal attaining the activated level. Therefore, when power is turned on, a potential of the power supply voltage divided by a resistance value of the first resistance element and a conductive resistance value of the first transistor is supplied to the inverter, to drive the reset signal to the activated level. When the divided potential exceeds a threshold potential of the inverter, the reset signal is driven to the inactivated level. Thus, the level of the power supply voltage at which the reset signal is driven from the activated level to the inactivated level can be set lower than in the conventional case, so that even a semiconductor device consuming less power and operating with less power supply voltage is enabled to generate a reset signal.

Preferably, the first resistance element includes a second transistor of a second conductivity type having its first electrode receiving the power supply potential, its second electrode connected to the input node of the inverter, and its input electrode receiving the reference potential. In this case, the inverter receives a potential of the power supply voltage divided by the conductive resistance values of the first and second transistors.

Preferably, the inverter includes: a third transistor of the second conductivity type having its first electrode receiving the power supply potential, its second electrode connected to an output node of the inverter, and its input electrode connected to the input node of the inverter; and a fourth transistor of the first conductivity type having its first electrode receiving the reference potential, its second electrode connected to the output node, and its input electrode connected to the input node. The predetermined threshold potential is set approximately equal to a threshold potential of the fourth transistor. In this case, it is possible to set the threshold potential of the inverter to a lowest possible level.

Preferably, a first capacitor having one electrode receiving the reference potential and the other electrode connected to the input node of the inverter, and a second capacitor having one electrode receiving the power supply potential and the other electrode connected to the output node of the inverter are further provided. In this case, it is possible to stabilize the potentials of the input node and the output node of the inverter.

Still preferably, the first capacitor includes a fifth transistor of the first conductivity type having its first and second electrodes both receiving the reference potential and its input electrode connected to the input node of the inverter, and the second capacitor includes a sixth transistor of the second conductivity type having its first and second electrodes both receiving the power supply potential and its input electrode connected to the output node of the inverter. In this case, the first and second capacitors can readily be constituted.

Preferably, a seventh transistor of the first conductivity type having its first electrode and its input node receiving the reference potential and its second electrode connected to the input node of the inverter, and an eighth transistor of the second conductivity type having its first electrode and its input electrode both receiving the power supply potential and its second electrode connected to the output node of the inverter are further provided. In this case, it is possible to drive the reset signal to the activated level even if the power supply potential is slowly raised up, thereby preventing malfunction of the semiconductor device.

Preferably, a second resistance element having one electrode receiving the reference potential and the other electrode connected to the input node of the inverter is further provided. In this case, it is possible to discharge the charges in the input node of the inverter via the second resistance element to the line of the reference potential after stopping the application of the power supply potential, so that the input node of the inverter can be driven to the reference potential in a short period of time.

Still preferably, the second resistance element includes a ninth transistor of the first conductivity type having its first electrode receiving the reference potential, its second electrode connected to the input node of the inverter, and its input electrode receiving the power supply potential. In this case, it is readily possible to constitute the second resistance element.

Preferably, a tenth transistor of the first conductivity type having its first electrode receiving the power supply potential and its second electrode connected to the input node of the inverter, a third resistance element having one electrode receiving the power supply potential and the other electrode connected to the input electrode of the tenth transistor, and a third capacitor having one electrode receiving the reference potential and the other electrode connected to the input electrode of the tenth transistor are further provided. In this case, after stopping the application of the power supply potential, charges at the input node of the inverter can be discharged via the first transistor, so that the input node of the inverter can be driven to the reference potential in a short period of time.

Still preferably, the third resistance element includes an eleventh transistor of the second conductivity type having its first electrode receiving the power supply potential, its second electrode connected to the input node of the inverter, and its input electrode receiving the reference potential. In this case, the third resistance element can readily be constituted.

Preferably, a fourth resistance element connected in series with the first resistance element between a line of the power supply potential and the input node of the inverter and having a resistance value that is sufficiently larger than the conductive resistance value of the first resistance element, and a fifth resistance element connected in series with the first transistor between a line of the reference potential and the input node of the inverter and having a resistance value sufficiently larger than the conductive resistance value of the first transistor are further provided. In this case, a potential of the power supply voltage divided by the fourth and fifth resistance elements is applied to the inverter, so that it is possible to stabilize the threshold voltage of the power on reset circuit.

Still preferably, the fourth and fifth resistance elements are made of the same material to have the same width, and have their resistance values set by their respective lengths. In this case, it is possible to suppress the variation in the resistance values of the fourth and fifth resistance elements. Thus, the threshold voltage of the power on reset circuit can further be stabilized.

Still preferably, the fourth and fifth resistance elements are each formed of a diffusion resistance layer. In this case, it is readily possible to constitute the fourth and fifth resistance elements.

Still preferably, the fourth and fifth resistance elements are each formed of a polycrystalline silicon layer. In this case, again, the fourth and fifth resistance elements can be readily constituted.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
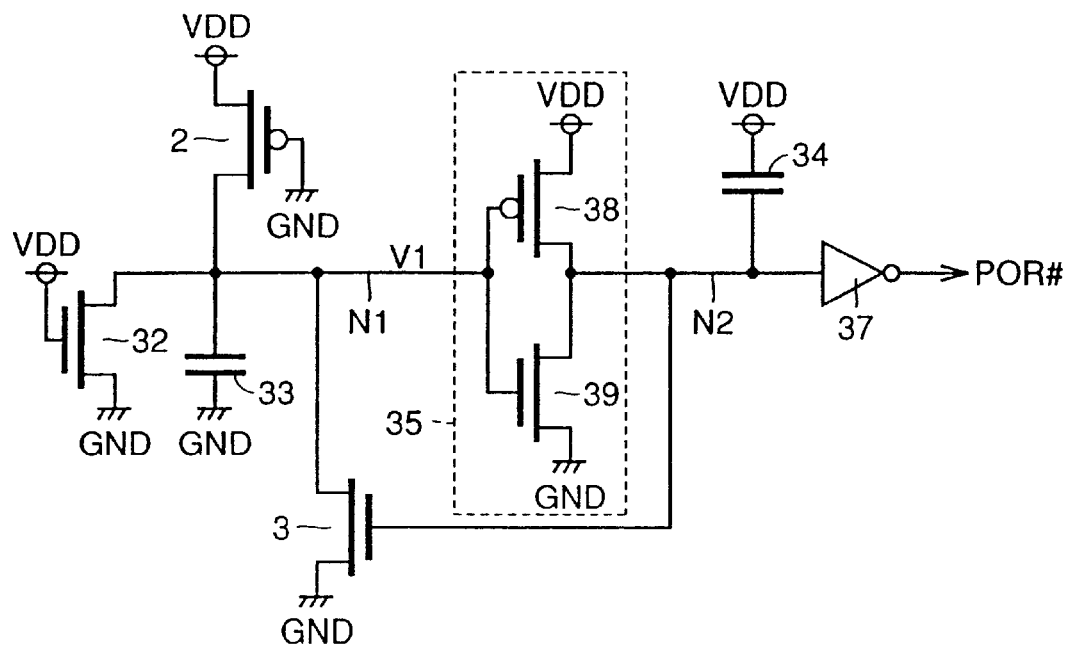
FIG. 1 is a circuit diagram showing a configuration of a power on reset circuit according to an embodiment of the present invention.
Figure 9:
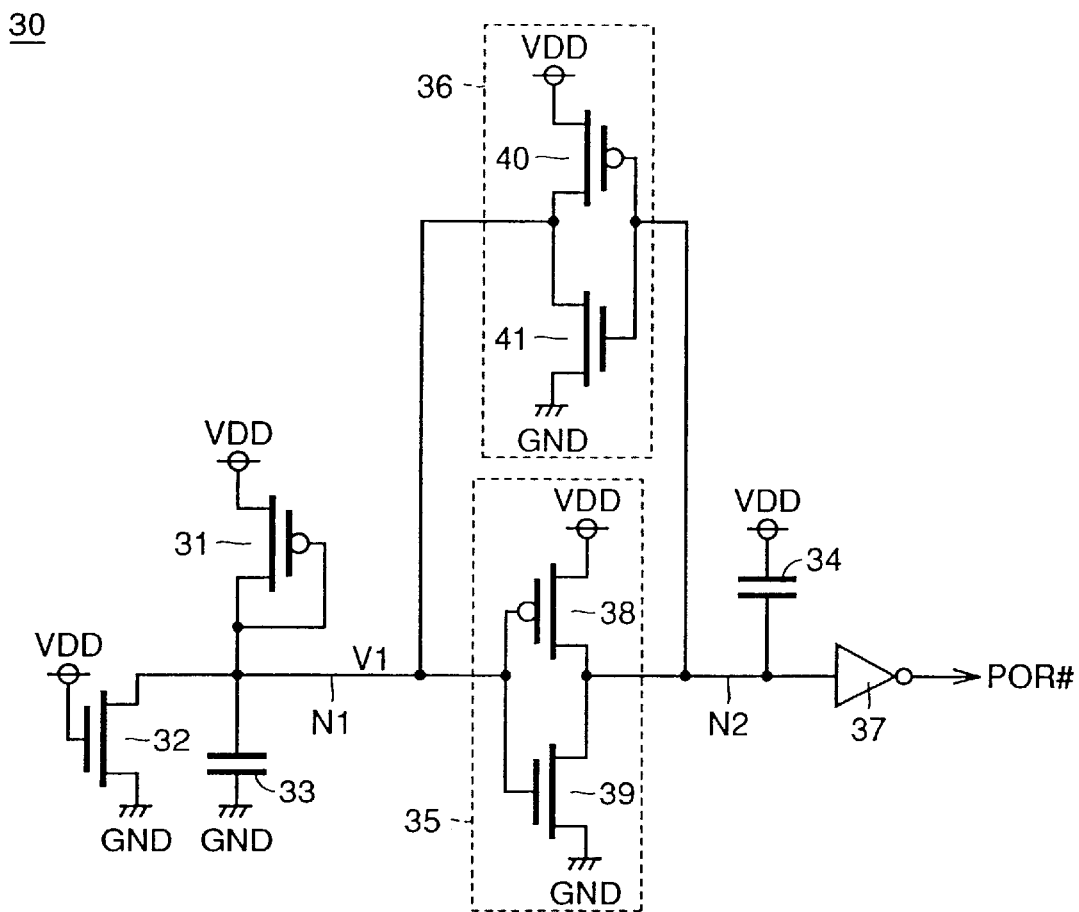
FIG. 9 is a circuit diagram showing a configuration of a conventional power on reset circuit.

A POR circuit 1 according to an embodiment of the present invention shown in FIG. 1 will be contrasted with the conventional POR circuit shown in FIG. 9.

POR circuit 1 shown in FIG. 1 is different from POR circuit 30 of FIG. 9 in that P channel MOS transistor 31 is replaced with a P channel MOS transistor 2, and inverter 36 is replaced with an N channel MOS transistor 3. P channel MOS transistor 2 is connected between a line of power supply potential VDD and node N1, and its gate is grounded. P channel MOS transistor 2 constitutes a resistance element. N channel MOS transistor 3 is connected between node N1 and a line of ground potential GND, and its gate is connected to node N2.

Hereinafter, Vres of POR circuit 1 will be described. The threshold voltage VTC of inverter 35 is equal to the threshold voltage VTN (=0.8 V) of N channel MOS transistor 39. Thus, when potential V1 of node N1 is lower than VTN, node N2 attains an H level, and N channel MOS transistor 3 is rendered conductive. P channel MOS transistor 2 has its gate grounded, and thus is conductive. Therefore, potential V1 of node N1 becomes a potential of power supply voltage VDD divided by P channel MOS transistor 2 and N channel MOS transistor 3. More specifically, when the conductive resistance values of P channel MOS transistor 2 and N channel MOS transistor 3 are represented as R2 and R3, respectively, then potential V1 of node N1 is equal to VDD·R3/(R2+R3).

When potential V1 of node N1 exceeds threshold potential VTN of inverter 35, potential V1 of node N1 inverts from an L level to an H level. Therefore, Vres being the power supply voltage VDD at the time when potential V1 of node N1 rises from an L level to an H level becomes equal to VTN(R2+R3)/R3. For example, if R2:R3=2:3, then Vres=0.8×5/3=1.33 V. This value is lower than Vres (=1.6 V) of POR circuit 30 shown in FIG. 9. POR circuit 1 can thus be used in 1.8 V and 1.5 V products.

Figure 2:
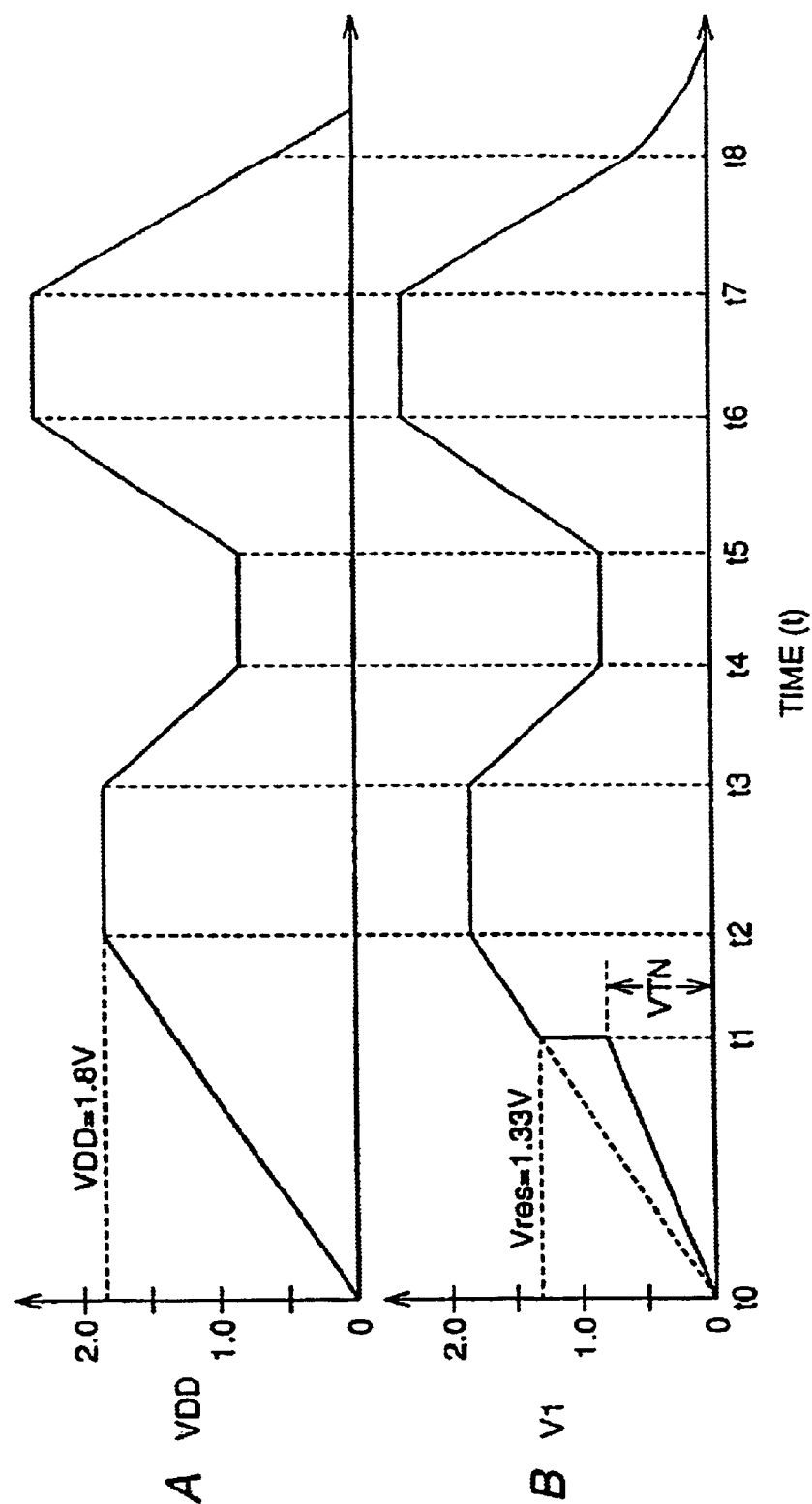
FIG. 2 shows time charts illustrating the operation of the power on reset circuit shown in FIG. 1.
Figure 10:
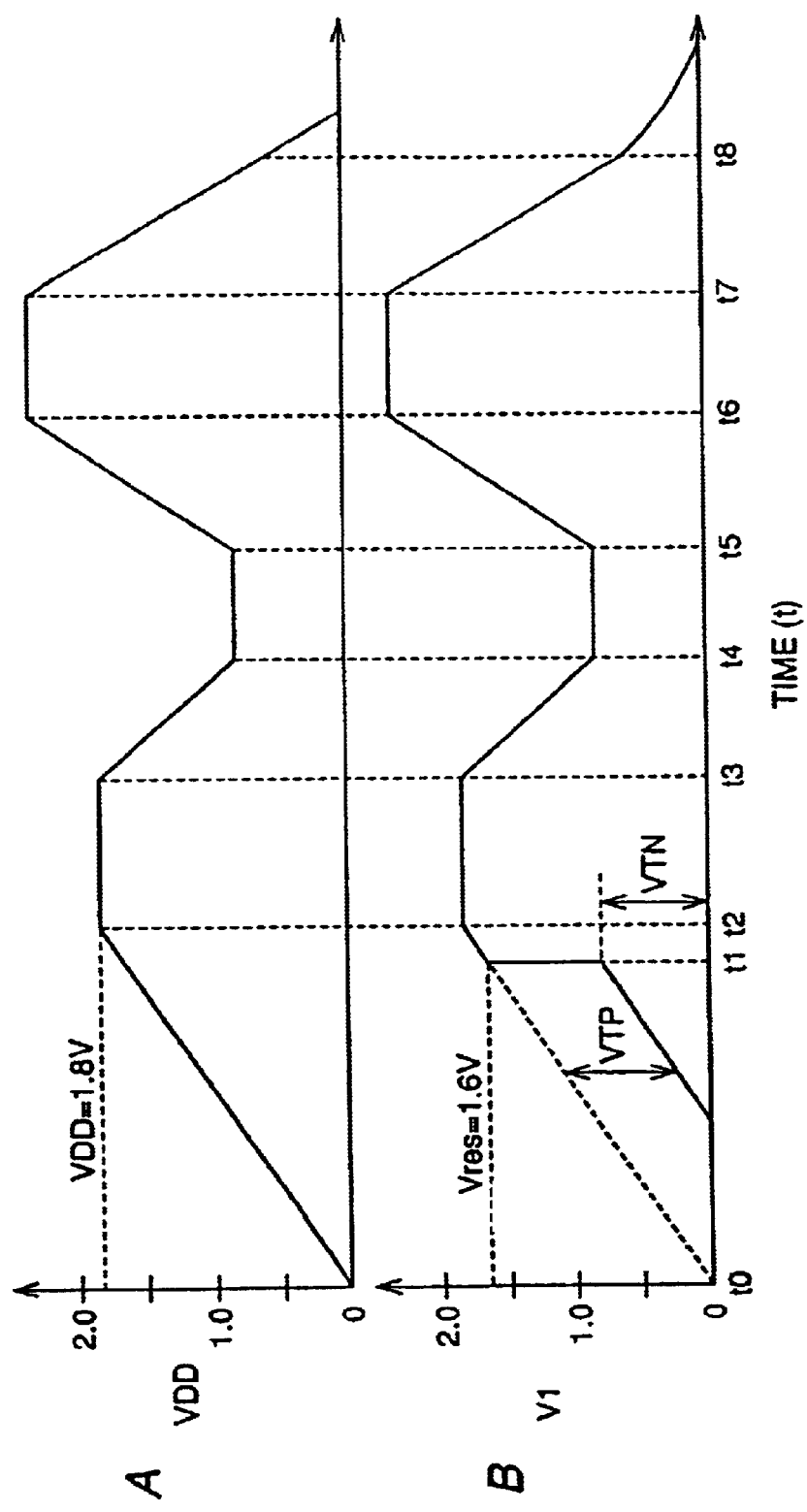
FIG. 10 shows time charts illustrating the operation of the power on rest circuit shown in FIG. 9.

The time charts shown in FIG. 2, illustrating the operation of POR circuit 1 of FIG. 1, will be contrasted with the charts in FIG. 10.

Referring to FIG. 2, at the initial state, node N1 is at a ground potential GND since it is grounded via a resistance element (N channel MOS transistor 32) of high resistance. Assume that external power supply potential VDD is switched on at time t0 and power supply potential VDD rises towards 1.8 V in proportion to time.

During the time period in which potential V1 of node N1 is lower than threshold potential VTN of inverter 35, node N2 is at an H level and N channel MOS transistor 3 is conductive. Potential V1 of node N1 becomes a value 3VDD/5, that is power supply potential VDD divided by P channel MOS transistor 2 and N channel MOS transistor 3 (time t0–t1).

When potential V1 (=3VDD/5) of node N1 exceeds threshold potential VTN of inverter 35 at time t1, the output level of inverter 35 inverts from an H level to an L level, and N channel MOS transistor 3 is rendered non-conductive. Potential V1 of node N1 rises from 3VDD/5 (=VTN) to VDD. Power supply voltage VDD at this time is Vres. In this POR circuit 1, Vres=1.33 V. Therefore, signal POR# is at an L level during the time period t0–t1, and it rises to an H level at time t1.

Even if power supply voltage VDD fluctuates in a range higher than VTN afterwards, V1=VDD, and thus, signal POR# remains at the H level (time t1–t7). When power supply voltage VDD drops and becomes lower than VTN (time t8), MOS transistors 2, 3, 38, 39 are rendered nonconductive. The charges stored in capacitor 33 are discharged via the highly resistive resistance element (N channel MOS transistor 32), and POR circuit 1 returns to its initial state.

Hereinafter, various modifications of the embodiment as described above will be described. In the modification shown in FIG. 3, N channel MOS transistor 32 and capacitors 33, 34 in POR circuit 1 of FIG. 1 are replaced with a resistance element 4, an N channel MOS transistor 5 and a P channel MOS transistor 6, respectively. Resistance element 4 having a high resistance value is provided to set the potential V1 of node N1 to 0V when power supply potential VDD is lowered to 0V. Resistance element 4 is formed of a diffusion resistance layer, a polycrystalline silicon layer or the like. N channel MOS transistor 5 has its gate connected to node N1, and its source and drain connected to the line of ground potential GND. P channel MOS transistor 6 has its gate connected to node N2, and its source and drain connected to the line of power supply potential VDD. The gate capacitance of N channel MOS transistor 5 and P channel MOS transistor 6 is provided to stabilize the potential at nodes N1 and N2, respectively. This modification allows achievement of the same effects as of POR circuit 1 of FIG. 1.

Figure 3:
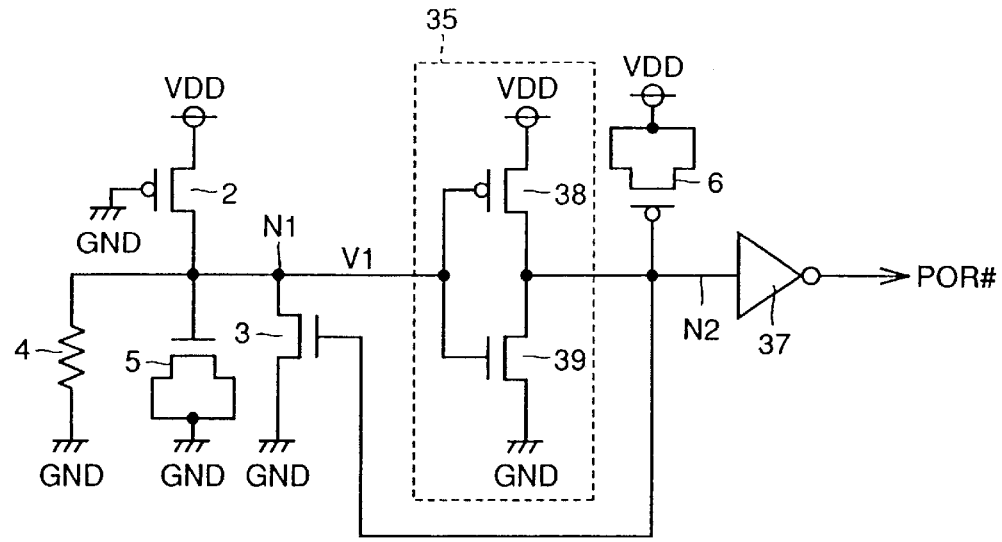
FIG. 3 is a circuit diagram showing a modification of the embodiment.

With the modification shown in FIG. 3, assume that the gate capacitance of N channel MOS transistor 5 and P channel MOS transistor 6 is both set small. In this case, when power supply potential VDD is slowly raised up, node N2 quickly attains an L level due to a leakage current of N channel MOS transistor 39 and, likewise, node N1 quickly attains an H level due to a leakage current of P channel MOS transistor 2. This causes signal POR# to remain at an L level for only an extremely short period of time, leading to malfunction of the semiconductor integrated circuit device. On the other hand, if the gate capacitance of N channel MOS transistor 5 and P channel MOS transistor 6 is both increased, it will result in an increased layout area.

Figure 4:
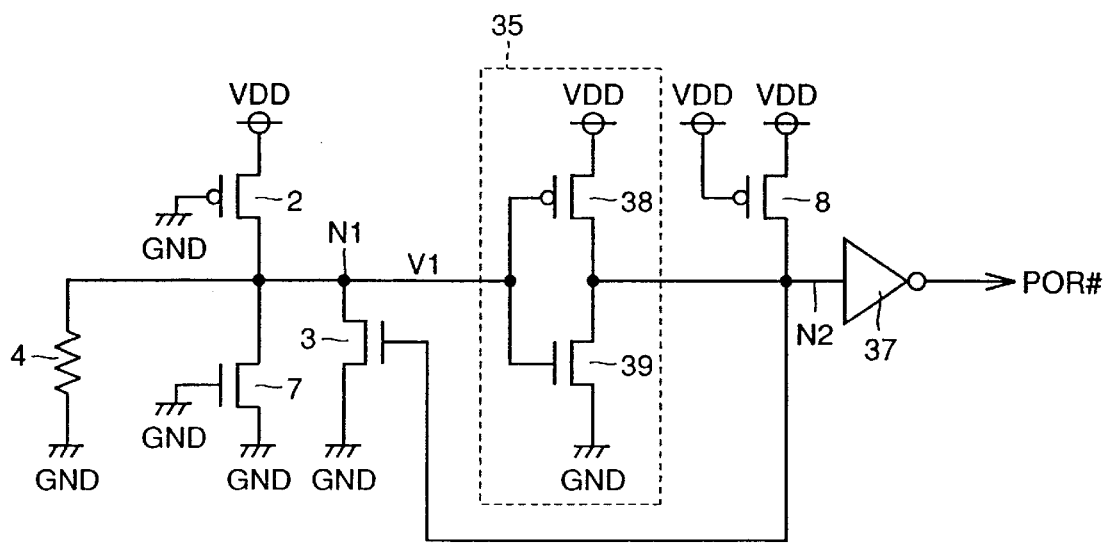
FIG. 4 is a circuit diagram showing another modification of the embodiment.

Thus, in another modification shown in FIG. 4, N channel MOS transistor 5 and P channel MOS transistor 6 in the POR circuit of FIG. 3 are replaced with an N channel MOS transistor 7 and a P channel MOS transistor 8, respectively. N channel MOS transistor 7 has its drain connected to node N1 and its gate and source connected to the line of ground potential GND. P channel MOS transistor 8 has its drain connected to node N2 and its gate and source connected to the line of power supply potential VDD. The sizes of MOS transistors 2 and 7 are set such that the leakage current of N channel MOS transistor 7 immediately after power-on is larger than the leakage current of P channel MOS transistor 2. Further, the sizes of MOS transistors 8 and 39 are set such that the leakage current of P channel MOS transistor 8 immediately after the power-on is larger than the leakage current of N channel MOS transistor 39.

Therefore, nodes N1 and N2 attain an L level and an H level, respectively, immediately after the power-on. Thereafter, as power supply potential VDD increases, the on current of P channel MOS transistor 2 increases, so that potential V1 of node N1 increases. When potential V1 of node N1 exceeds the threshold potential VTN of inverter 35, the potential of node N2 is lowered from an H level to an L level, and signal POR# is raised from an L level to an H level. In other words, potential V1 of node N1 is determined by the current driving capabilities of P channel MOS transistor 2 and N channel MOS transistor 7, regardless of the rising speed of power supply potential VDD. Therefore, even if power supply potential VDD is slowly raised up, signal POR# remains at an L level for a prescribed time. Thus, malfunction of the semiconductor integrated circuit device is prevented.

Figure 5:
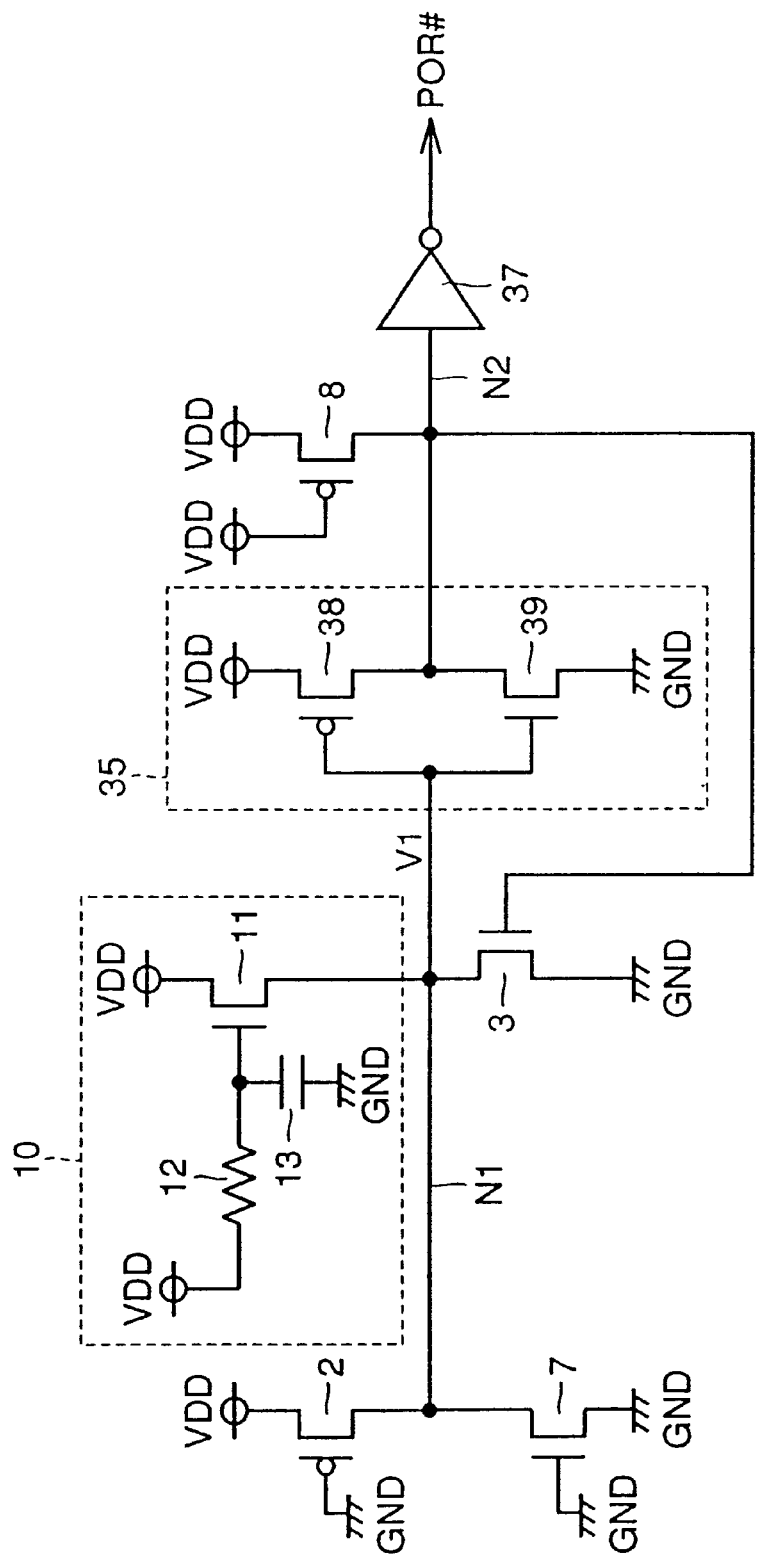
FIG. 5 is a circuit diagram showing yet another modification of the embodiment.

In the modification shown in FIG. 5, resistance element 4 of the POR circuit shown in FIG. 4 is replaced with a pull-down circuit 10. Pull-down circuit 10 includes an N channel MOS transistor 11, a resistance element 12 and a capacitor 13. N channel MOS transistor 11 is connected between the line of power supply potential VDD and node N1, and has its gate connected to the line of power supply potential VDD via resistance element 12 as well as to the line of ground potential GND via capacitor 13.

During the time period in which power supply potential VDD is applied, capacitor 13 is charged to power supply potential VDD. During the time period in which potential V1 of node N1 is at an H level, a leakage current does not flow in N channel MOS transistor 11. Thus, the current consumption is reduced compared to the case of the POR circuit of FIG. 4 where the leakage current flows through resistance element 4. When the application of power supply potential VDD is stopped, the charges in capacitor 13 are gradually discharged via resistance element 12 to the line of power supply potential VDD, and correspondingly, the gate potential of N channel MOS transistor 11 gradually decreases. At this time, N channel MOS transistor 11 is in an on state, so that the charges on node N1 are discharged via N channel MOS transistor 11 to the line of power supply potential VDD. Thus, the potential V1 of node N1 becomes 0V.

Figure 6:
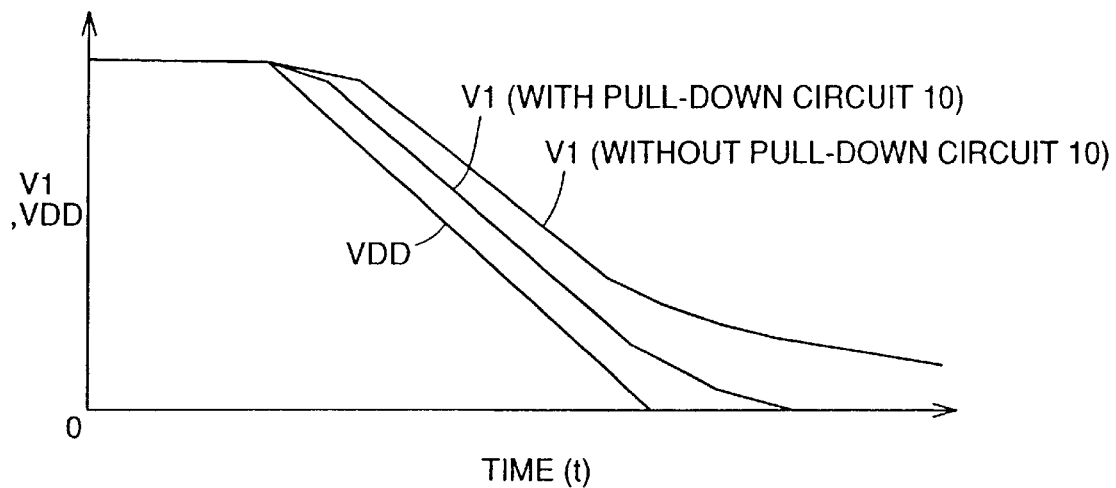
FIG. 6 is a time chart illustrating effects of the power on reset circuit shown in FIG. 5.

Referring to FIG. 6 illustrating the effects of the POR circuit of FIG. 5, when the application of power supply potential VDD is stopped at a given time, the potential of the line of power supply potential VDD starts to decrease with time. Without pull-down circuit 10, it takes a long time until the potential V1 of node N1 becomes 0V, and therefore, if power supply potential VDD is switched on again before potential V1 reaching 0V, the semiconductor integrated circuit device is likely to malfunction. Conversely, with pull-down circuit 10, potential V1 of node N1 reaches 0V quickly, and therefore, even if power supply potential VDD is switched on again afterwards, malfunction of the semiconductor integrated circuit device is unlikely to occur.

Figure 7:
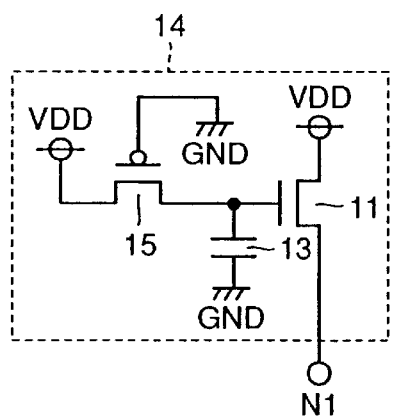
FIG. 7 is a circuit diagram showing a further modification of the embodiment.

In the modification shown in FIG. 7, pull-down circuit 10 of the POR circuit shown in FIG. 5 is replaced with a pull-down circuit 14. Pull-down circuit 14 is identical to pull-down circuit 10 except that the resistance element 12 is replaced with a P channel MOS transistor 15. P channel MOS transistor 15 is connected between the line of power supply potential VDD and the gate of N channel MOS transistor 11, and has its gate receiving ground potential GND. In this modification, again, the effects the same as in the POR circuit of FIG. 5 can be accomplished.

In the respective POR circuit shown in FIGS. 1–7, power supply potential VDD is divided by resistance value R2 of P channel MOS transistor 2 and resistance value R3 of N channel MOS transistor 3 before being applied to inverter 35. However, if the gate lengths and/or the threshold voltages of MOS transistors 2, 3 vary due to variation in manufacturing processes, resistance values R2, R3 of MOS transistors 2, 3 will vary, thereby altering the threshold voltage Vres of the POR circuit considerably.

Figure 8:
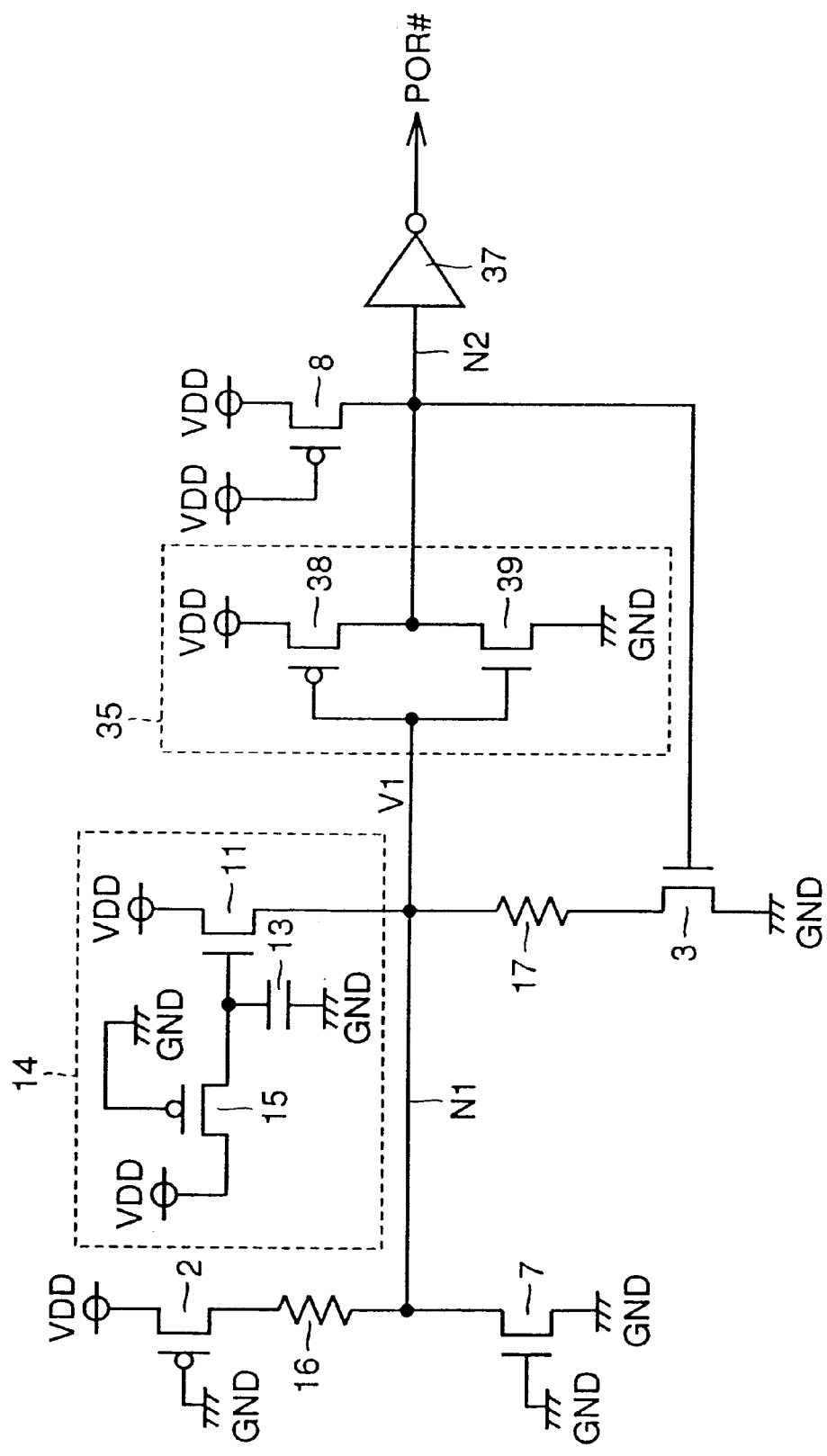
FIG. 8 is a circuit diagram showing yet another modification of the embodiment.

Thus, in the modification shown in FIG. 8, resistance elements 16, 17 are added to the POR circuit of FIG. 7.

Resistance element 16 is interposed between the drain of P channel MOS transistor 2 and node N1. Resistance element 17 is interposed between node N1 and the drain of N channel MOS transistor 3. Resistance elements 16, 17 are each formed of a diffusion resistance layer, a polycrystalline silicon layer or the like. Resistance elements 16, 17 are formed of the same material to have the same width, and their lengths determine their respective resistance values R16, R17. Resistance values R16, R17 of resistance elements 16, 17 are set sufficiently larger than resistance values R2, R3 of MOS transistors 2, 3 at the time when power supply potential VDD reaches the threshold potential Vres of the POR circuit. Therefore, threshold voltage Vres of the POR circuit becomes equal to VTN(R16+R17)/R17. Thus, in this modification, resistance values R16, R17 of resistance elements 16, 17 are less likely to be affected by the process variation compared to resistance values R2, R3 of MOS transistors 2, 3. Thus, it becomes possible to stabilize threshold voltage Vres of the POR circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power on reset circuit incorporated in a semiconductor device and generating a reset signal for resetting said semiconductor device when power is turned on, comprising:

an inverter driving said reset signal to an activated level in response to reception of a power supply potential and a reference potential, and driving said reset signal to an inactivated level in response to a potential of an input node of the inverter exceeding a predetermined threshold potential;

a first resistance element having one electrode receiving said power supply potential and another electrode connected to the input node of said inverter; and a first transistor of a first conductivity type having a first electrode receiving said reference potential and a second electrode connected to the input node of said inverter, and rendered conductive in response to said reset signal attaining the activated level;

wherein said first resistance element includes a second transistor of a second conductivity type having a first electrode receiving said power supply potential, a second electrode connected to the input node of said inverter and an input electrode receiving said reference potential;

wherein said inverter includes a third transistor of the second conductivity type having a first electrode receiving said power supply potential, a second electrode connected to an output node of said inverter and an input electrode connected to the input node of said inverter, and a fourth transistor of the first conductivity type having a first electrode receiving said reference potential, a second electrode connected to said output node and an input electrode connected to said input node, said predetermined threshold potential being made approximately equal to a threshold potential of said fourth transistor;

a seventh transistor of the first conductivity type having a first electrode and an input electrode both receiving said reference potential and a second electrode connected to the input node of said inverter; and an eighth transistor of the second conductivity type having a first electrode and an input electrode both receiving said power supply potential and a second electrode connected to the output node of said inverter.

* * * * *